(12) United States Patent
Kim et al.

(10) Patent No.: US 8,416,545 B2
(45) Date of Patent: Apr. 9, 2013

(54) POWER AMPLIFIER MODULE WITH SHARED ESD PROTECTION CIRCUIT

(75) Inventors: Ki Joong Kim, Jeollabuk-do (KR); Youn Suk Kim, Gyunggi-do (KR); Dae Seok Jang, Gyunggi-do (KR); Young Jean Song, Gyunggi-do (KR); Jun Goo Won, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 94 days.

(21) Appl. No.: 13/177,001

(22) Filed: Jul. 6, 2011

(65) Prior Publication Data

US 2012/0044604 A1 Feb. 23, 2012

(30) Foreign Application Priority Data

Aug. 19, 2010 (KR) .................. 10-2010-0080535

(51) Int. Cl.
*H02H 9/00* (2006.01)

(52) U.S. Cl.
USPC .......................................................... 361/56

(58) Field of Classification Search ............ 361/56
See application file for complete search history.

(56) References Cited

U.S. PATENT DOCUMENTS

| 7,518,841 | B2 | 4/2009 | Chuang et al. |
| 8,194,372 | B1* | 6/2012 | Chong et al. ............... 361/56 |
| 2007/0262418 | A1 | 11/2007 | Degani et al. |

FOREIGN PATENT DOCUMENTS

KR 10-2008-0111670 A 12/2008

OTHER PUBLICATIONS

Korean Office Action, w/ English translation thereof, issued in Korean Patent Application No. KR 10-2010-0080535 dated Jul. 27, 2011.

* cited by examiner

*Primary Examiner* — Ronald W Leja
(74) *Attorney, Agent, or Firm* — McDermott Will & Emery LLP

(57) ABSTRACT

Disclosed is a power amplifier module with a shared ESD protection circuit. There is provided a power amplifier module including: an ESD protection circuit that is connected to an output terminal of the LDO part, an output conductive wire pad that outputs the operating power of the LDO part; a printed conductive wire pad that is electrically connected to the output conductive wire pad of the PA controller; a first power coupler that includes a first primary side conductive wire electrically connected to the printer conductive wire pad; a second power coupler that includes a second primary side conductive wire electrically connected to the printer conductive wire pad; a first PA part; and a second PA part, wherein each of the first PA part and the second PA part is protected from ESD by the ESD protection circuit.

13 Claims, 3 Drawing Sheets

POWER AMPLIFIER MODULE WITH SHARED ESD PROTECTION CIRCUIT

CROSS-REFERENCE TO RELATED APPLICATIONS

This application claims the priority of Korean Patent Application No. 10-2010-0080535 filed on Aug. 19, 2010, in the Korean Intellectual Property Office, the disclosure of which is incorporated herein by reference.

BACKGROUND OF THE INVENTION

1. Field of the Invention

The present invention relates to a power amplifier module that may be applied to a global system for mobile communications (GSM) terminal, and more particularly, to a power amplifier module with a shared electrostatic discharge (ESD) protection circuit in which a high band power amplifier (PA) and a low band PA share the ESD protection circuit connected to an output terminal of a low drop output (LDO).

2. Description of the Related Art

Generally, a power amplifier for a GSM terminal is configured of a balanced power amplifier (PA) including a high band PA and a low band PA using a CMOS process technology and supplies power from an LDO of a PA controller to the high band PA and the low band PA.

In addition, each of the high band PA and the low band PA is configured of a plurality of amplifiers and is designed to have a structure able to couple and output power from each PA through a low loss substrate and a Cu 10 µm process, an integrated passive device (IPD) process, and a coupling conductive wire.

The GSM power amplifier module, according to the related art, includes a PA controller, a high band PA, a low band PA, a high band IPD power coupler, and a low band IPD power coupler that are formed on a single substrate.

As a countermeasure for protecting against ESD, the GSM power amplifier module according to the related art includes ESD protection circuits that are mounted at each output terminal of the PA controller, the high band PA, and the low band PA, such that each of the PA controller, the high band PA, and the low band PA may be protected from ESD.

However, the GSM power amplifier module according to the related art has the following problems: as the ESD protection circuits are provided at each output terminal of the PA controller, the high band PA, the low band PA to increase the size of the GSM power amplifier module and when the output signals from each of the high band PA and the low band PA are large, the output signals are limited by the ESD protection circuits and consequently, may not be output.

SUMMARY OF THE INVENTION

An aspect of the present invention provides a power amplifier module with a shared ESD protection circuit capable of reducing a size of the power amplifier module while providing an electrostatic discharge protect function by allowing a high band PA and a low band PA to share an ESD protection circuit connected to an output terminal of a low drop output (LDO).

According to an exemplary embodiment of the present invention, there is provided a power amplifier module, including: a PA controller including an input conductive pad that receives power, an LDO part that receives power from the input conductive pad to supply operating power, an ESD protection circuit that is connected to an output terminal of the LDO part, an output conductive wire pad that outputs the operating power of the LDO part; a printed conductive wire pad that is electrically connected to the output conductive wire pad of the PA controller; a first power coupler that includes a first primary side conductive wire electrically connected to the printed conductive wire pad; a second power coupler that includes a second primary side conductive wire electrically connected to the printed conductive wire pad; a first PA part that is connected to both ends of the first primary side conductive wire to receive operating power and amplifies a signal including a predetermined first band and outputs the amplified signal to the first power coupler; and a second PA part that is connected to both ends of the second primary side conductive wire to receive the operating power and amplifies a signal including a predetermined second band and outputs the amplified signal to the second power coupler, wherein each of the first PA part and the second PA part is protected from ESD by the ESD protection circuit.

The printed conductive wire pad may be connected to the output conductive wire pad of the PA controller by a bonding conductive wire having impedance for interrupting a high frequency.

The printed conductive wire pad may be connected to the output conductive wire pad of the PA controller by a plurality of bonding conductive wires having impedance for interrupting a high frequency.

The first primary side conductive wire may have a connection point connected to the printed conductive wire pad by the bonding conductive wire having impedance for interrupting a high frequency. The connection point of the first primary side conductive wire may be an intermediate point of the first primary side conductive wire configured as a conductive pattern having a predetermined length.

The second primary side conductive wire may have a connection point connected to the printed conductive wire pad by the bonding conductive wire having impedance for interrupting a high frequency. The connection point of the second primary side conductive wire may be an intermediate point of the second primary side conductive wire configured as a conductive pattern having a predetermined length.

The first band may be a global system for mobile communications (GSM) high band and the second band may be a global system for mobile communications (GSM) low band.

According to another exemplary embodiment of the present invention, there is provided a power amplifier module, including: a PA controller including an input conductive pad that receives power, an LDO part that receives power from the input conductive pad to supply operating power, an ESD protection circuit that is connected to an output terminal of the LDO part, an output conductive wire pad that outputs the operating power of the LDO part; a printed conductive wire pad that is connected to the output conductive wire pad of the PA controller by a bonding conductive wire having impedance for removing high frequency; a first power coupler that includes a first primary side conductive wire connected to the printed conductive wire pad by a bonding conductive wire having impedance for removing high frequency; a second power coupler that includes a second primary side conductive wire connected to the printed conductive wire pad by a bonding conductive wire having impedance for removing high frequency; a first PA part that is connected to both ends of the first primary side conductive wire to receive operating power and amplifies a signal including a predetermined GSM high band and outputs the amplified signal to the first power coupler; and a second PA part that is connected to both ends of the second primary side conductive wire to receive the operating power and amplifies a signal including a predetermined GSM low band and outputs the amplified signal to the second power coupler, wherein each of the first PA part and the second PA part is protected from ESD by the ESD protection circuit.

The first primary side conductive wire may have a connection point connected to the printed conductive wire pad by a bonding conductive wire. The connection point of the first primary side conductive wire may be an intermediate point of the first primary side conductive wire configured as a conductive pattern having a predetermined length.

The second primary side conductive wire may have a connection point connected to the printed conductive wire pad by a bonding conductive wire. The connection point of the second primary side conductive wire may be an intermediate point of the second primary side conductive wire configured as a conductive pattern having a predetermined length.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
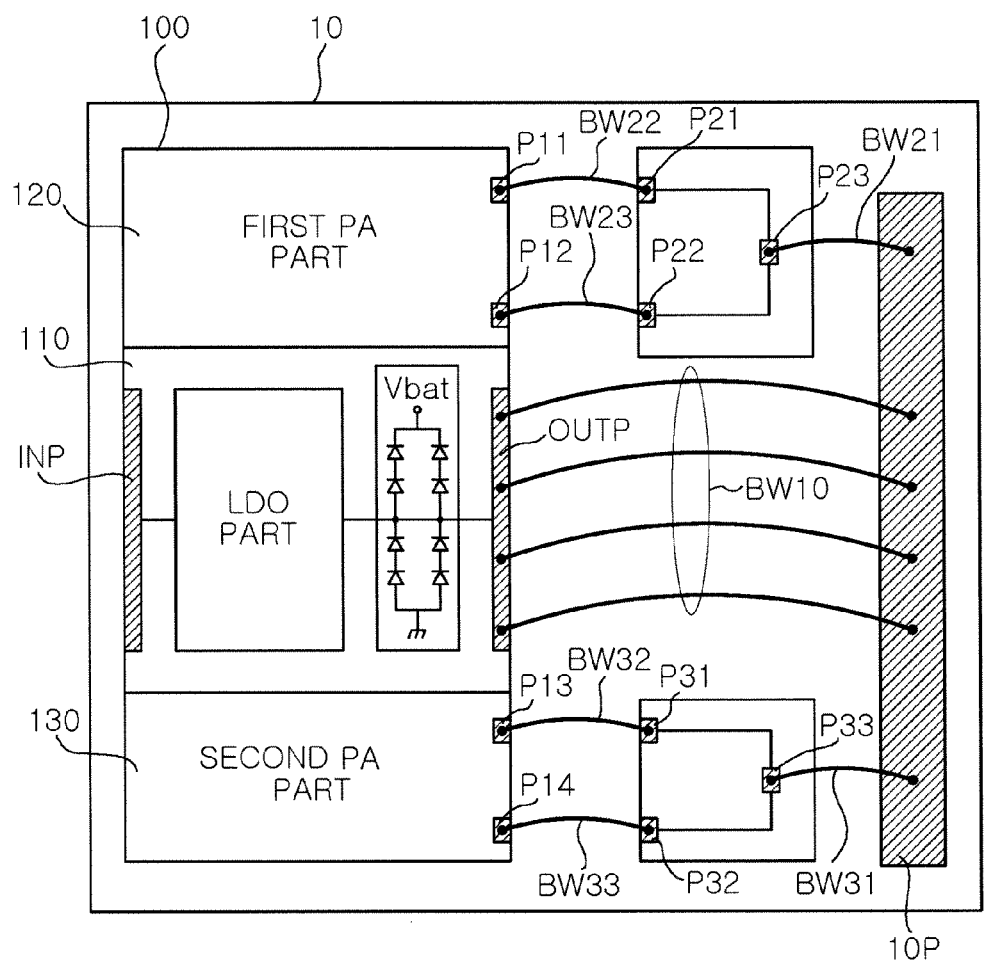
FIG. 1 is a block diagram showing an arrangement of a power amplifier module according to an exemplary embodiment of the present invention.

Exemplary embodiments of the present invention will now be described in detail with reference to the accompanying drawings. The exemplary embodiments of the present invention may be modified in many different forms and the scope of the invention should not be limited to the embodiments set forth herein. Rather, these embodiments are provided so that this disclosure will be thorough and complete, and will fully convey the concept of the invention to those skilled in the art. In the drawings, the shapes and dimensions may be exaggerated for clarity, and the same reference numerals will be used throughout to designate the same or like components.

Figure 2:
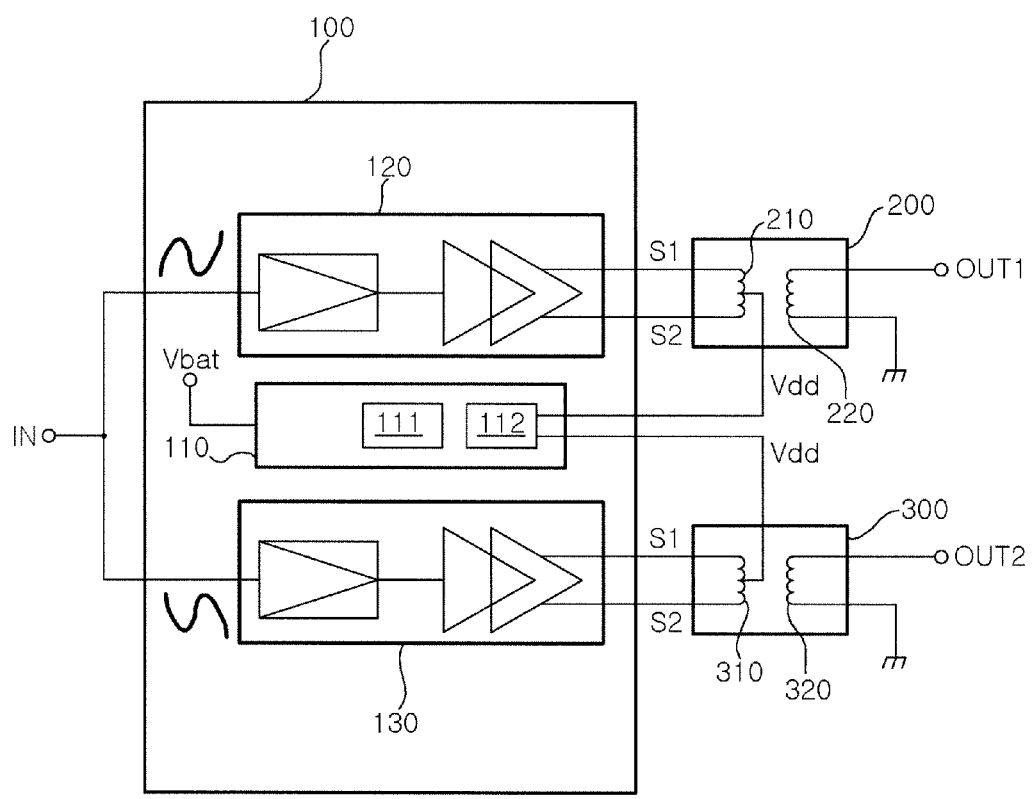
FIG. 2 is a circuit block diagram showing the power amplifier module according to the exemplary embodiment of the present invention.

FIG. 1 is a block diagram showing an arrangement of a power amplifier module according to an exemplary embodiment of the present invention and FIG. 2 is a circuit block diagram showing the power amplifier module according to the exemplary embodiment of the present invention.

Referring to FIGS. 1 and 2, a power amplifier module according to a first exemplary embodiment of the present invention may include a PA controller 110 including an input conductive pad INP that receives power Vbat, an LDO part 111 that receives power from the input conductive pad INP to supply operating power Vdd, an ESD protection circuit 112 that is connected to an output terminal of the LDO part 111, and an output conductive wire pad OUTP that outputs the operating power Vdd of the LDO part 111.

The power amplifier module according to the first exemplary embodiment of the present invention may include a printed conductive wire pad 10P that is electrically connected to the output conductive wire pad OUTP of the PA controller 110, a first power coupler 200 that includes a first primary side conductive wire 210 electrically connected to the printed conductive wire pad 10P, and a second power coupler 300 that includes a second primary side conductive wire 310 electrically connected to the printed conductive wire pad 10P.

The power amplifier module according to the first exemplary embodiment of the present invention may include a first PA part 120 that is connected to both ends of the first primary side conductive wire 210 to receive operating power Vdd and amplifies a signal including a predetermined first band and outputs the amplified signal to the first power coupler 200, and a second PA part 130 that is connected to both ends of the second primary side conductive wire 310 to receive the operating power Vdd and amplifies a signal including a predetermined second band and outputs the amplified signal to the second power coupler 300.

In this configuration, each of the first PA part 120 and the second PA part 130 may be protected from ESD by the ESD protection circuit 112.

In this case, the ESD protection circuit 112 may be configured of a plurality of general diodes or zener diodes in order to bypass voltage higher than a predetermined positive (+) voltage or voltage lower than a predetermined negative (−) voltage to a ground.

In addition, according to the exemplary embodiment of the present invention, the PA controller 110, the first PA part 120, and the second PA part 130 may be configured as a single integrated circuit (IC).

The printed conductive wire pad 10P may be configured to be connected to the output conductive wire pad OUTP of the PA controller 110 by a bonding conductive wire having impedance for interrupting a high frequency.

The printed conductive wire pad 10P may be configured to be connected to the output conductive wire pad OUTP of the PA controller 110 by a plurality of bonding conductive wires having impedance for interrupting a high frequency.

The first primary side conductive wire 210 may be configured to have a connection point connected to the printed conductive wire pad 10P by the bonding conductive wire having impedance for interrupting a high frequency. In this case, the connection point of the first primary side conductive wire 210 may be an intermediate point of the first primary side conductive wire 210 that is configured as a conductive pattern having a predetermined length.

In addition, the second primary side conductive wire 310 may be configured to have a connection point connected to the printed conductive wire pad 10P by the bonding conductive wire having impedance for interrupting a high frequency. In this case, the connection point of the second primary side conductive wire 310 may be an intermediate point of the second primary side conductive wire 310 that is configured as a conductive pattern having a predetermined length.

In the above-mentioned exemplary embodiment of the present invention, the first band may be a global system for mobile communications (GSM) high band and the second band may be a global system for mobile communications (GSM) low band. In this case, the GSM high band may, for example, include a DCS 1800 and a PCS 1900 frequency band, and the GSM low band may, for example, include a GSM 850 and an EGSM frequency band.

Figure 3:
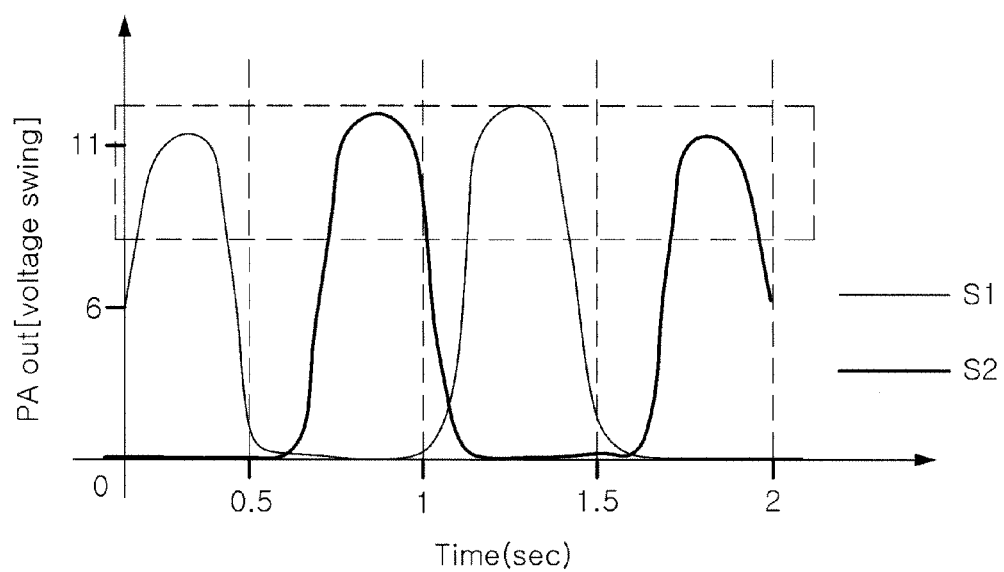
FIG. 3 is a waveform diagram of first and second output signals of a power IC according to an exemplary embodiment of the present invention.

FIG. 3 is a waveform diagram of first and second output signals of a power IC according to an exemplary embodiment of the present invention. In FIG. 3, first and second output signals S1 and S2 are differential signals having a phase difference of 180°, which are RF signals output from each of the high band PA and the low band PA.

Hereinafter, the action and effect of the exemplary embodiment of the present invention will be described in detail with reference to the accompanying drawings.

Referring to FIGS. 1 to 3, in the power amplifier module according to the first exemplary embodiment of the present invention, the LDO part 111 of the PA controller 110 may receive power from the input conductive pad INP to supply the operating power Vdd through the output conductive wire pad OUTP.

In this case, the LDO part 111 may be protected from ESD voltage having a magnitude of a considerably high voltage by the ESD protection circuit 112 connected to the output terminal of the LDO part 111.

Continuously, the operating power Vdd supplied from the LDO part 111 may pass through the printed conductive wire pad 10P connected through a bonding conductive wire BW10 and may then be supplied to the first PA part 120 through the first primary side conductive wire 210 of the first power coupler 200 connected to the printed conductive wire pad 10P through a bonding conductive wire BW21.

Therefore, the first PA part 120 may be operated by being supplied with the operating power Vdd from the LDO part 111 through the bonding conductive wire BW10, the printed conductive wire pad 10P, the bonding conductive wire BW21, and the first primary side conductive wire 210 (hereinafter, referred to as "first bonding conductive wire path') to amplify and output the high frequency signal of the input GSM high band.

That is, as shown in FIG. 3, the differential signals including the first and second signals S1 and S2 output from the first PA part 120 may be transferred from the first primary side conductive wire 210 of the first power coupler 200 to a first secondary side conductive wire 220 by electromagnetic coupling and may be output through a first output terminal OUT1 connected to the first secondary side conductive wire 220.

In addition, the second PA part 130 may be operated by being supplied with the operating power Vdd from the LDO part 111 through the bonding conductive wire BW10, the printed conductive wire pad 10P, the bonding conductive wire BW31, and the second primary side conductive wire 310 (hereinafter, referred to as "second bonding conductive wire path') to amplify and output the high frequency signal of the input GSM low band.

That is, as shown in FIG. 3, the differential signals including the first and second signals S1 and S2 output from the second PA part 130 may be transferred from the second primary side conductive wire 310 to a second secondary side conductive wire 320 of the second power coupler 300 by electromagnetic coupling and may be output through a second output terminal OUT2 connected to the second secondary side conductive wire 320.

Meanwhile, as described above, each of the first PA part 120 and the second PA part 130 may be supplied with DC voltage, that is, the operating power Vdd from the LDO part 111 through the first and second boding conductive wire paths, but the signals output from the first PA part 120 and the second PA part 130 are high frequency signals, and therefore, are interrupted by the first and second bonding conductive wire paths having impedance for interrupting the high frequency.

In addition, when the ESD voltage is introduced from each output terminal of the first PA part 120 and the second PA part 130, the ESD voltage may be a DC voltage of considerably high voltage, several kV for example, and is therefore bypassed to the ground through the bonding conductive wire by the ESD protection circuit 112, such that each of the first PA part 120 and the second PA part 130 may be protected from the ESD voltage by the ESD protection circuit 112.

The exemplary embodiment as described above has a structure that may be protected from ESD by connecting ESD to the ESD protection circuit of the output terminal of the LDO part, the primary side of the IPD power coupler, and a drain of the MOS transistor of the PA part through the conductive wire bonding, without applying the ESD protection circuit to the drain of the MOS transistor of the PA part.

For example, the PA part is the power module of the power coupling manner and when the PA part is ESD-connected to the RF output terminal, the operating power Vdd may be bypassed to the ground due to the operation of the ESD protection circuit at the RF switching voltage of 8V or more and thus, a malfunction in which the output signals cannot be normally output may occur. However, the exemplary embodiment of the present invention may provide the ESD protection function while normally outputting the large output signals.

As set forth above, the exemplary embodiment of the present invention may allow the high band PA and the low band PA to share the electrostatic discharge (ESD) protection circuit connected to the output terminal of the low drop output (LDO), thereby reducing the size of the power amplifier module while providing the ESD protection function.

While the present invention has been shown and described in connection with the exemplary embodiments, it will be apparent to those skilled in the art that modifications and variations can be made without departing from the spirit and scope of the invention as defined by the appended claims.

What is claimed is:

1. A power amplifier module, comprising:
a power amplifier (PA) controller including an input conductive pad receiving power, a low drop output (LDO) part receiving power from the input conductive pad to supply operating power, an electrostatic discharge (ESD) protection circuit connected to an output terminal of the LDO part, an output conductive wire pad outputting the operating power of the LDO part;
a printed conductive wire pad electrically connected to the output conductive wire pad of the PA controller;
a first power coupler including a first primary side conductive wire electrically connected to the printer conductive wire pad;
a second power coupler including a second primary side conductive wire electrically connected to the printed conductive wire pad;
a first PA part connected to both ends of the first primary side conductive wire to receive operating power and amplify a signal including a predetermined first band and to output the amplified signal to the first power coupler; and
a second PA part connected to both ends of the second primary side conductive wire to receive the operating power and amplify a signal including a predetermined second band and output the amplified signal to the second power coupler,
the first PA part and the second PA part each being protected from ESD by the ESD protection circuit.

2. The power amplifier module of claim 1, wherein the printed conductive wire pad is connected to the output conductive wire pad of the PA controller by a bonding conductive wire having impedance for interrupting a high frequency.

3. The power amplifier module of claim 1, wherein the printed conductive wire pad is connected to the output conductive wire pad of the PA controller by a plurality of bonding conductive wires having impedance for interrupting a high frequency.

4. The power amplifier module of claim 1, wherein the first primary side conductive wire has a connection point connected to the printed conductive wire pad by the bonding conductive wire having impedance for interrupting a high frequency.

5. The power amplifier module of claim 4, wherein the connection point of the first primary side conductive wire is an intermediate point of the first primary side conductive wire configured as a conductive pattern having a predetermined length.

6. The power amplifier module of claim 1, wherein the second primary side conductive wire has a connection point connected to the printed conductive wire pad by the bonding conductive wire having impedance for interrupting a high frequency.

7. The power amplifier module of claim 6, wherein the connection point of the second primary side conductive wire is an intermediate point of the second primary side conductive wire configured as a conductive pattern having a predetermined length.

8. The power amplifier module of claim 1, wherein the first band is a global system for mobile communications (GSM) high band and the second band is a global system for mobile communications (GSM) low band.

9. A power amplifier module, comprising:
a PA controller including an input conductive pad receiving power, an LDO part receiving power from the input conductive pad to supply operating power, an ESD protection circuit connected to an output terminal of the LDO part, an output conductive wire pad outputting the operating power of the LDO part;
a printed conductive wire pad connected to the output conductive wire pad of the PA controller by a bonding conductive wire having impedance for removing high frequency;
a first power coupler including a first primary side conductive wire connected to the printed conductive wire pad by a bonding conductive wire having impedance for removing high frequency;
a second power coupler including a second primary side conductive wire connected to the printed conductive wire pad by a bonding conductive wire having impedance for removing high frequency;
a first PA part connected to both ends of the first primary side conductive wire to receive operating power and amplify a signal including a predetermined GSM high band and output the amplified signal to the first power coupler; and
a second PA part connected to both ends of the second primary side conductive wire to receive the operating power and amplify a signal including a predetermined GSM low band and output the amplified signal to the second power coupler,
the first PA part and the second PA part each being protected from ESD by the ESD protection circuit.

10. The power amplifier module of claim 9, wherein the first primary side conductive wire has a connection point connected to the printed conductive wire pad by a bonding conductive wire.

11. The power amplifier module of claim 10, wherein the connection point of the first primary side conductive wire is an intermediate point of the first primary side conductive wire configured as a conductive pattern having a predetermined length.

12. The power amplifier module of claim 9, wherein the second primary side conductive wire has a connection point connected to the printed conductive wire pad by a bonding conductive wire.

13. The power amplifier module of claim 12, wherein the connection point of the second primary side conductive wire is an intermediate point of the second primary side conductive wire configured as a conductive pattern having a predetermined length.

* * * * *